United States Patent [19]

Looper

[11] 4,393,347
[45] Jul. 12, 1983

[54] COMMON MODE VOLTAGE REJECTION CIRCUIT

[75] Inventor: Norman G. Looper, San Diego, Calif.

[73] Assignee: Action Instruments Co. Inc., San Diego, Calif.

[21] Appl. No.: 175,800

[22] Filed: Aug. 6, 1980

[51] Int. Cl.³ ............................ G01R 1/30; H03F 3/68
[52] U.S. Cl. .................................. 324/126; 324/123 R; 330/69; 330/258
[58] Field of Search .................. 324/126, 128, 123 R; 328/163, 165; 330/69, 258

[56] References Cited

U.S. PATENT DOCUMENTS

| | | | |
|---|---|---|---|
| 2,999,948 | 9/1961 | Beckwith | 328/163 |
| 3,209,277 | 9/1965 | Burwen | 330/69 |
| 3,629,719 | 8/1969 | Heller et al. | 330/69 |
| 3,652,949 | 3/1972 | Szabo | 330/69 |

Primary Examiner—Ernest F. Karlsen
Attorney, Agent, or Firm—Henri J. A. Charmasson

[57] ABSTRACT

A circuit for reducing the amplitude of a common mode voltage across the inputs of a differential measuring instrument. The circuit comprises a voltage divider between each of the differential input terminals and the instrument zero reference point on one side, and between the instrument's zero reference point and the common mode voltage reference (usually earth) on the other side. A potentiometer forms the divider junction at the instrument reference point and is used to compensate for resistance value tolerances in the circuit and any imbalance in the input path impedances of the two differential inputs. The value of the voltage divider resistors are selected so as to bring the instrument reference point as close as possible to the level of the common mode voltage without unduly reducing the instrument input impedance.

3 Claims, 3 Drawing Figures

COMMON MODE VOLTAGE REJECTION CIRCUIT

DESCRIPTION

1. Field of the Invention

The present invention relates to electronic measurement instruments and more particularly to high accuracy voltmeters and amplifiers designed to measure low level voltage differences between two DC signals. The invention is particularly applicable to the measurement of thermocouple voltage, strain gauge voltages, and the output signals of from various types of transducers which are multiplexed in order to be sequentially applied to a single measuring instrument.

The output signal of a Wheatstone bridge configuration strain gauge is the difference between the voltage at two opposite corners of the bridge. These two corners have a common voltage roughly equivalent to one-half the supply voltge applied across the two other corners of the bridge. If the supply voltage is not tied to the same zero reference point as the measurement instrument, there may be added an unspecified amount of common mode voltage at the differential inputs of the instruments. Electromagnetic pickup and ground lead resistance can further add to the AC and DC common mode pollution. This common mode voltage may seriously affect the accuracy of the measurement if there is an imbalance between the input path impedances or any differences in the characteristics of the instrument differential stages. The problem is compounded when the transducer is distant from the measuring instrument, as is common in most industrial control settings. In making temperature measurements with thermocouples, the bimetallic configuration of the sensor results in an inherent input impedance path imbalance. In some cases, the common mode voltage may exceed the breakdown voltage at the input of the measuring instrument.

2. Prior Art

AC common mode voltage of 6 kilohertz and above can conveniently be eliminated with appropriate filtering without unduly affecting the input characteristics of the measuring instrument. The rejection of low frequency and DC common mode voltage has been effected in the past by insulating the measuring instrument in a Faraday cage, and by other active and passive guard techniques. There are two basic approaches in preventing a common mode current from flowing through the input of the measuring instrument. The first approach is to completely isolate the zero reference point of the instrument from the reference point of the common mode voltage source (usually earth). The other approach is to drive the instrument zero reference point to the level of the common mode voltage. These techniques are coupled with appropriate shielding of the input leads against electromagnetic pickup. In a a multiple transducer measurement system the most effective method for common mode rejection to date is illustrated in FIG. 1, marked "prior art".

The measuring instrument I comprises a differential amplifier A forming its input stage, and is entirely contained in a Faraday cage F which is completely insulated from the earth E by a guard crossing circuit C. The measuring instrument I has its own zero reference point B which may be free-floating or connected to the Faraday enclosure F as the conditions of the system may require. Each pair of signal input leads is shielded by a guard sleeve G which is connected to one side of the signal source, is switched through the multiplexer M and is tied to the Faraday enclosure F on the common side of the multiplexer M. Various sources of common mode voltage CM are shown applied to the strain gauge transducers SC and the thermocouple TC. The Faraday cage F and guard crossing circuit C provide an effective barrier against the flow of these common mode voltages through the instrument I.

The main drawback of this system configuration is the necessity of switching the shields G along with the input signals through a three-level multiplexing system M. Furthermore, high insulation must be maintained between the instrument I and the Faraday cage F as well as between the Faraday cage F and earth E. Any leakage would immediately cause some of the common mode currents to flow through the leads and to severely affect the accuracy of measurements.

SUMMARY OF THE INVENTION

The principal object of the invention is to minimize the common mode excursions experienced by a differential measurement instrument such as an amplifier by balancing its input leads and by establishing the zero reference point of the instrument at a well-defined impedance relative to earth.

A second object of the invention is to eliminate the switching of the input leads shield in multi-transducer systems thereby limiting the multiplexer to a two-pole switch for each channel, and reducing its costs.

A third objet of the invention is to maintain an effectively high input impedance for the measuring instrument by a judicious choice of absolute and relative values of the components of a front end common mode voltage rejection circuit.

A fourth object of the invention is to realize and maintain high common mode rejection over a wide temperature range using inexpensive components such as carbon and metal film resistors.

These and other objects are achieved by a simple voltage divider circuit which generates a driving potential for the Faraday cage and the instrument zero reference point, and provides a potentiometer for adjusting the effect of imbalance in the path resistance of the input leads.

DESCRIPTION OF THE PREFERRED EMBODIMENT

Figure 2:
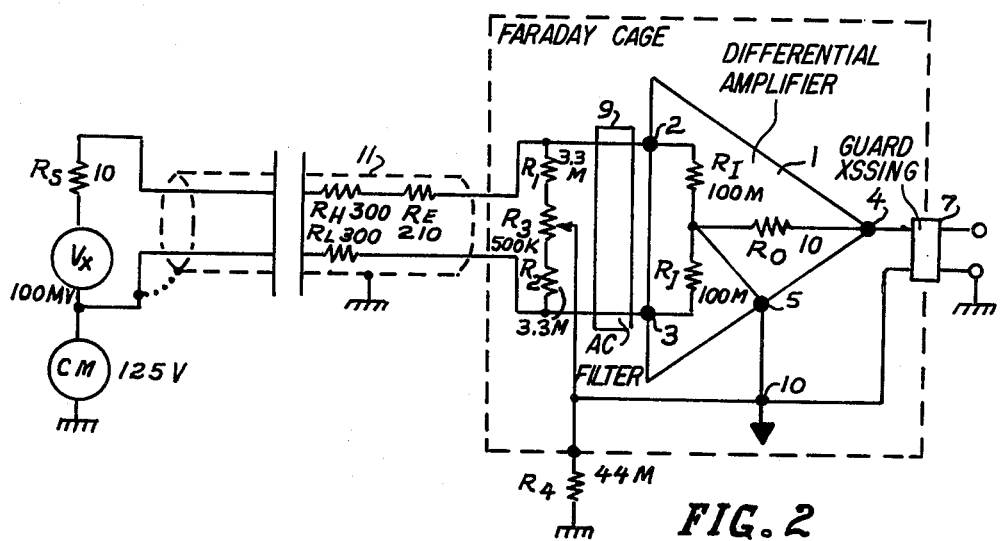
FIG. 2 is a schematic illustrating the invention in a single signal configuration.

Referring now to FIG. 2 of the drawing, there is illustrated a differential input amplifier 1 improved by a common mode rejection circuit in accordance with the present invention. The amplifier has two differential input terminals 2 and 3, an output terminal 4 and a zero reference terminal 5. The input impedance is represented by resistors RI and the output impedance is represented by resistor RO. The amplifier 1 is housed in a Faraday cage 6 and is insulated from the ground reference output terminal 8 by a guard crossing circuit 7. The signal to be measured is represented by generator VX having a source impedance RS. Resistors RH and RL represent the respective path impedances of the input leads, and RE represents the imbalance between these path impedances. The source common mode voltage is represented by generator CM which is referenced to the earth. The values assigned to the various components are those commonly encountered in the measurement of physical phenomena such as pressure and temperature through strain gauge and thermocouple transducers in an industrial process control, where a measurement accuracy of 0.1% or better is often desirable. The input leads between the signal source VX and the amplifier 1 are shield by a metallic sleeve 11 which is tied to earth in order to reduce electromagnetic pickups. The sleeve 11 could alternately be connected to one side of the signal source VX as indicated by a broken line in the drawing. Resistors R1, R2, R4, and potentiometer R3 form a voltage divider between each input lead and the zero reference point 10 of the amplifier 1 on one side, and between the zero reference point 10 and earth on the other side. The cursor (i.e., wiper) of potentiometer R3 which constitutes the node of the three-pronged voltage dividers is adjusted to compensate for the tolerance values of resistors R1 and R2. Note that the Faraday cage 6 is also connected to the zero reference point 10 of the amplifier 1. Resistor R4 establishes the impedance between this junction point 10 and earth. This connection reduces any uncertainty due to variations in the leakage resistance and parasitic capacity between the amplifier 1 and the earth due to change in the ambient humidity and other factors. Any common mode current flowing through the input leads is drained through the voltage divider, and, by reason of the value ratio of R1 or R2 and R3 on one part and R4 on the other, a suitable fraction of the common mode voltage, in this case about 93%, appears across resistance R4. Any imbalance in the respective input attenuations of the common mode voltage due to the presence of RE (the difference in input lead resistance) can be compensated by adjusting the potentiometer R3, although this is not always practical or necessary in industrial scenarios. Since the amplifier zero reference point 10 and the Faraday cage 6 are connected to R4, the complete measurement system is passively driven at a level close to the common mode voltage.

When the potentiometer R3 is adjusted fo perfect balance, the dividing factor of the network constituted by R1, R2 and R3 corresponds to the ratio of the input path resistance of the second signal over the input path resistance of the first original including the effect of said network or said respective input path resistances.

The value of the potentiometer R3 must be large enough to compensate for the largest assumed tolerances of the network components values, for the differences in input path impedance and for the variation in instrument impedances.

It cannot be denied that the installation of the voltage divider substantially reduces the input impedance of the amplifier 1 from 200 megohms to approximately 7 megohms. However, an investigation of typical source impedances from transducers, including thermocouple wires, shows that the overall accuracy loss due to the reduction in input impedance is reasonably small when compared to other error sources and is a small price to pay for the overwhelming advantage of attenuating high common mode voltages to functional levels with a few inexpensive components. For example, in the example illustrated in FIG. 2, equivalent to 300 feet of #26 AWG thermocouple wire, the amount of signal loss due to the installation of the voltage divider is in the order of 0.01% and the common mode rejection ratio (CMRR) is still −84 dB, even without adjusting R3.

Figure 1:
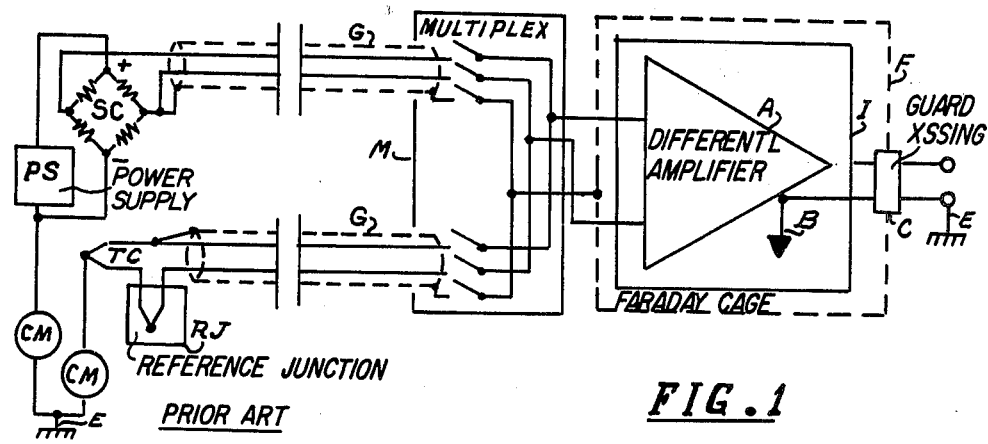
FIG. 1 is a schematic illustrating the best known prior art for eliminating the common mode voltage in a multi-channel system for the measurement of low-level DC signals.
Figure 3:
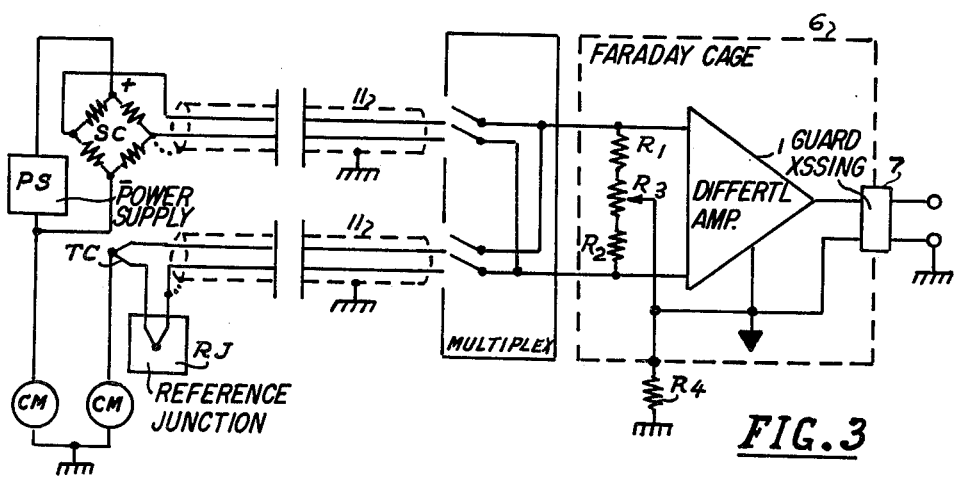
FIG. 3 is a schematic illustrating application of the invention to a multi-channel system similar to the one illustrated in FIG. 1.

Referring now to FIG. 3, there is illustrated an application of the present invention to a multi-channel measurement system similar to the one illustrated in FIG. 1. It should be noted that the invention, by eliminating the necessity of switching the shield surrounding each pair of input leads, greatly reduces the complexity of the multiplexer. These shields II can be either tied to earth as illustrated, or tied to one of the input leads close to the source of the signal as shown in broken lines.

Although the invention has been described in relation to purely resistive impedances, those skilled in the electrical arts will clearly understand that its principles are equally applicable to circuits comprising complex impedances wih capacitive and inductive components. The disclosed common node reducing ratiometric network could in such cases include inductances and capacitors elements in order to achieve the desired rejection.

While I have described the preferred embodiment of the invention, other embodiments could be devised and modifications could be made thereto without departing from the spirit of the invention and the scope of the appended claims.

I claim:

1. In an electrical apparatus for measuring minute differential voltage levels between a first low-source-impedance signal applied to the apparatus positive input terminal and a second low-source-impedance signal applied to the apparatus negative input terminal in the presence of substantial common-mode voltages in reference to earth, wherein said apparatus has balanced high input impedances between each of said terminals and the apparatus zero-reference point, and wherein said zero-reference point is isolated from earth, an improvement for limiting the effect of any unbalance between the input-path impedances of said signals which comprises:
a low-impedance shunt across each of the input terminals and the apparatus zero-reference point; and
a high-impedance shunt between the apparatus zero-reference point and earth;
wherein the value of said low-impedance shunt in relation to the high-impedance shunt is selected so as to attenuate the common-mode voltages without reducing the terminal input impedances in relation to the signal source-impedances to a point where the measurement error due to the signal source impedance is likely to be equal or greater than the measurement error due to the effect of the common-mode voltages in the absence of said low-impedance and high-impedance shunts.

2. The improvement claimed in claim 1 wherein at least one of said low-impedance shunts is adjustable to a degree sufficient to equalize the overall impedances between the signal sources and the apparatus zero-reference point.

3. The improvement claimed in claim 2 wherein said shunts comprise:
a potentiometer;
a first resistor between the positive input terminal and one end of the potentiometer;
a second resistor between the negative input terminal and the other end of the potentiometer; and
a third resistor having one end connected to the cursor of the potentiometer and the apparatus zero-reference point, and the other end connected to earth.

* * * * *